(12) United States Patent
Schittler Neves et al.

(10) Patent No.: US 12,557,670 B2
(45) Date of Patent: Feb. 17, 2026

(54) SEMICONDUCTOR WIRELESS TRANSMITTER/RECEIVER WITH CHIP CARRIER HAVING INTEGRALLY FORMED ANTENNA

(71) Applicant: Infineon Technologies AG, Neubiberg (DE)

(72) Inventors: Eduardo Schittler Neves, Olching (DE); Rainer Markus Schaller, Saal a.d. Donau (DE); Matthias Eberl, Taufkirchen (DE); Franz Michael Darrer, Graz (AT)

(73) Assignee: Infineon Technologies AG, Neubiberg (DE)

( * ) Notice: Subject to any disclaimer, the term of this patent is extended or adjusted under 35 U.S.C. 154(b) by 76 days.

(21) Appl. No.: 17/305,885

(22) Filed: Jul. 16, 2021

(65) Prior Publication Data

US 2022/0028764 A1    Jan. 27, 2022

(30) Foreign Application Priority Data

Jul. 27, 2020    (DE) .......................... 102020119688.1

(51) Int. Cl.
| | |
|---|---|
| H01L 23/495 | (2006.01) |
| H01L 21/48 | (2006.01) |
| H01L 21/56 | (2006.01) |
| H01L 23/29 | (2006.01) |
| H01L 23/31 | (2006.01) |
| H01Q 1/22 | (2006.01) |

(52) U.S. Cl.
CPC .... *H01L 23/49551* (2013.01); *H01L 21/4842* (2013.01); *H01L 21/56* (2013.01); *H01L 23/295* (2013.01); *H01L 23/3107* (2013.01); *H01Q 1/2283* (2013.01)

(58) Field of Classification Search
CPC ........... H01L 23/49551; H01L 21/4842; H01L 21/56; H01L 23/295; H01L 23/3107; H01L 23/49555; H01Q 1/2283
USPC ......................................................... 257/676
See application file for complete search history.

(56) References Cited

U.S. PATENT DOCUMENTS

| | | | |
|---|---|---|---|
| 6,180,433 B1 | 1/2001 | Furey et al. | |
| 7,061,083 B1* | 6/2006 | Usami .............. | G06K 19/07363 |
| | | | 257/679 |
| 7,342,299 B2 | 3/2008 | Gaucher et al. | |
| 9,263,421 B2* | 2/2016 | Lee ........................ | H01L 25/50 |
| 9,692,142 B2* | 6/2017 | Ek ......................... | H01Q 5/371 |
| 9,922,910 B2* | 3/2018 | Otremba ............. | H01L 23/4006 |

(Continued)

FOREIGN PATENT DOCUMENTS

| | | |
|---|---|---|
| CN | 1330789 A | 1/2002 |
| CN | 1937225 A | 3/2007 |

(Continued)

*Primary Examiner* — Davienne N Monbleau
(74) *Attorney, Agent, or Firm* — Harrity & Harrity, LLP

(57) ABSTRACT

A semiconductor device comprises a semiconductor chip and an electrically conductive chip carrier, wherein the semiconductor chip is mounted on the chip carrier. The semiconductor device furthermore comprises an electrically conductive extension element mechanically connected to the chip carrier, wherein the extension element and the chip carrier are formed as an integral single piece. A part of the chip carrier which has the extension element is configured as an antenna.

21 Claims, 5 Drawing Sheets

(56) References Cited

U.S. PATENT DOCUMENTS

| | | | |
|---|---|---|---|
| 2007/0164907 A1 | 7/2007 | Gaucher et al. | |
| 2017/0125881 A1* | 5/2017 | Mangrum | H01Q 1/2283 |
| 2017/0162620 A1* | 6/2017 | Wang | G06V 40/1306 |
| 2019/0169019 A1* | 6/2019 | Wachtler | H01L 23/3135 |
| 2019/0214352 A1 | 7/2019 | Tsai et al. | |
| 2019/0252363 A1* | 8/2019 | Lin | H01L 21/6835 |
| 2019/0320424 A1* | 10/2019 | Yerramalli | H04L 5/003 |

FOREIGN PATENT DOCUMENTS

| | | |
|---|---|---|
| CN | 104882440 A | 9/2015 |
| CN | 110137158 A | 8/2019 |
| WO | 98/48378 A2 | 10/1998 |
| WO | 2006/061345 A1 | 6/2006 |

* cited by examiner

SEMICONDUCTOR WIRELESS TRANSMITTER/RECEIVER WITH CHIP CARRIER HAVING INTEGRALLY FORMED ANTENNA

CROSS REFERENCE TO RELATED APPLICATION

This application claims priority to German Patent Application No. 102020119688.1 filed on Jul. 27, 2020, the content of which is incorporated by reference herein in its entirety.

TECHNICAL FIELD

The present disclosure relates to semiconductor devices comprising wireless transmitters and/or wireless receivers.

BACKGROUND

Semiconductor devices comprising wireless transceivers can have antennas in order to emit and receive electromagnetic waves. In some communication techniques, such as, for example, Wi-Fi, Bluetooth, ZigBee, etc., the antennas may usually be present in the form of separate components, which can result in higher system costs and an increased space requirement on the printed circuit board.

SUMMARY

Various aspects relate to a semiconductor device. The semiconductor device comprises a semiconductor chip and an electrically conductive chip carrier, wherein the semiconductor chip is mounted on the chip carrier. The semiconductor device furthermore comprises an electrically conductive extension element mechanically connected to the chip carrier, wherein the extension element and the chip carrier are formed as an integral single piece. A part of the chip carrier which has the extension element is configured as an antenna.

Various aspects relate to a method for producing a semiconductor device. The method comprises fabricating an electrically conductive chip carrier and mounting a semiconductor chip on a mounting plane of the chip carrier. The method furthermore comprises bending a part of the chip carrier out of the mounting plane, wherein at least one section of the chip carrier which has the bent part is configured as an antenna.

BRIEF DESCRIPTION OF THE DRAWINGS

Methods and devices in accordance with the disclosure are explained in greater detail below with reference to drawings. The elements shown in the drawings are not necessarily rendered in a manner true to scale relative to one another. Identical reference signs can designate identical components.

DETAILED DESCRIPTION

The figures described below show devices and methods in accordance with the disclosure. In this case, the devices and methods described may be presented in a general way in order to qualitatively describe aspects of the disclosure. The devices and methods described can have further aspects, which may not be illustrated in the respective figure for the sake of simplicity. However, the respective aspect can be augmented by aspects described in connection with other aspects in accordance with the disclosure. Consequently, explanations concerning a specific figure may equally apply to aspects of other figures.

Figure 1:
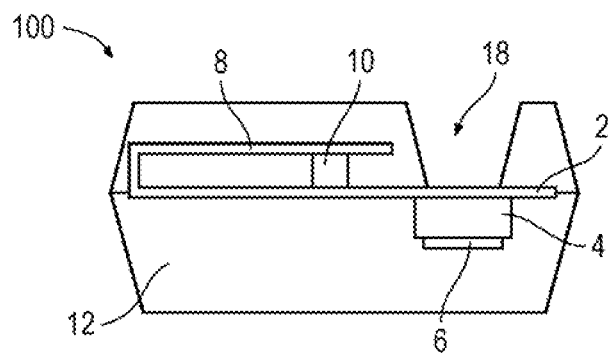
FIG. 1 is a diagram schematically illustrating a cross-sectional side view of a semiconductor device, in accordance with the disclosure.

The semiconductor device 100 in FIG. 1 can have an electrically conductive chip carrier 2 and a micro electro-mechanical system (MEMS) sensor chip 4 mounted on the underside of the chip carrier. Furthermore, a logic chip 6 can be arranged on the MEMS sensor chip 4. An electrically conductive extension element 8 can be mechanically connected to the chip carrier 2. A spacer 10 can optionally be arranged between the chip carrier 2 and the extension element 8. The aforementioned components of the semiconductor device 100 can be at least partly encapsulated by an encapsulation material 12.

The MEMS sensor chip 4 can be a semiconductor chip comprising one or more MEMS structures that can be integrated into the MEMS sensor chip 4. The MEMS sensor chip 4 can be configured to detect one or more physical variables, for example pressure, acceleration, temperature, air humidity, and/or the like. Examples of sensors are pressure sensors, tire pressure sensors, acceleration sensors, gas sensors, air humidity sensors, and/or the like. In some aspects, as shown in FIG. 1, a pressure sensor may be included as part of a tire pressure monitoring system (TPMS). In some aspects, as shown in FIG. 1, the MEMS sensor chip 4 can be left with its top side not covered by the encapsulation material 12, in order that MEMS structures of the MEMS sensor chip 4 can detect physical variables. In some aspects, the encapsulation material 12 can have an opening or depression 18 at the position of the MEMS sensor chip 4.

The logic chip 6 or one or more circuits contained therein can be configured to logically process measurement signals provided by the MEMS sensor chip 4. The logic chip 6 can be an ASIC (Application Specific Integrated Circuit), for example. In some aspects, as shown in FIG. 1, the logic chip 6 can be integrated into the semiconductor device 100. In further aspects, the logic chip 6 can be arranged outside the semiconductor device 100, in particular next to the semiconductor device 100 on the same printed circuit board. The logic chip 6 can thus be regarded as part of the semiconductor device 100, or not regarded as part thereof. In some aspects, as shown in FIG. 1, the MEMS sensor chip 4 and the logic chip 6 are illustrated as two separate semiconductor chips. In further aspects, the two chips can also be combined in a single monolithic component.

A part of the chip carrier 2 which has the extension element 8 can be configured as an antenna. In some aspects, the antenna can be formed exclusively by the extension element 8, while in a further aspect, the extension element 8 and at least one part of the chip carrier 2 can function as an antenna. The extension element 8 configured as an antenna or as part of an antenna can be structured such that an emission of electromagnetic radiation is optimized. By way of example, the extension element can have a meandering, spiral or coil-shaped course, as viewed from above. Example courses of extension elements in accordance with the disclosure are shown and described in FIGS. 5-7 and 11.

The antenna formed by the extension element 8 can be configured to emit signals detected by the MEMS sensor chip 4 and processed by the logic chip 6. In some aspects, as shown in FIG. 1, such signals can be emitted upward, wherein the radiation can have an aperture angle of up to 180 degrees. In further aspects, the signals can also be emitted in all directions. The emission in this case can take place with direction-dependently different intensities. Operation of the antenna need not be restricted to a specific wireless communication technique. By way of example, the communication technique used can be based on at least one of the following: Wi-Fi, Bluetooth, ZigBee, UWB (Ultra Wide Band), 434 MHz, radio-frequency millimeter waves, and/or the like.

The chip carrier 2 and the extension element 8 can be formed as an integral single piece. In some aspects, upon a transition from the chip carrier 2 to the extension element 8, and vice versa, no contact resistance can occur based on the chip carrier 2 and the extension element 8 being formed as an integral single piece. A contact resistance can be specified as an electrical resistance that arises upon a connection of components or materials at the contact point between these components. A contact resistance can arise as a result of any type of connection by which different materials are connected to one another, for example soldered connections, plug connections, switching connections, line connections, and/or the like. In accordance with the disclosure, the chip carrier 2 and the extension element 8 may not be components connected in such a way, and so no contact resistance can occur. The integral piece formed by the chip carrier 2 and the extension element 8 may not be additively manufactured, but rather may be produced by employing a subtractive manufacturing technique. By way of example, the integral piece may be manufactured from an identical, in particular homogenous, material, as is shown and described with respect to FIGS. 11A and 11B.

The extension element 8 can be formed by a bent part of the chip carrier 2, for example. In this case, the extension element 8 can be bent out of the mounting plane in which the MEMS sensor chip 4 is mounted. In this case, the chip carrier 2 can be bent such that the extension element 8 and the mounting plane have sections which are situated opposite one another and which run substantially parallel. The spacer 10 can prevent the chip carrier 2 and the extension element 8 from mechanically contacting one another. In this case, the spacer 10 can be manufactured from an arbitrary electrically insulating material, for example. In FIG. 1, the chip carrier 2 can be bent such that the MEMS sensor chip 4 and the extension element 8 can be arranged over opposite surfaces of the chip carrier 2.

In some aspects, as shown in FIG. 1, the extension element 8 can be completely encapsulated by the encapsulation material 12. In addition, further components of the semiconductor device 100 can be embedded in the encapsulation material 12. The encapsulation material 12 can thus form a package for the components of the semiconductor device 100, and so the latter can also be referred to as a semiconductor package. The encapsulation material 12 can comprise for example at least one from a mold compound, a laminate, an epoxy, a filled epoxy, a glass-fiber-filled epoxy, an imide, a thermoplastic, a thermosetting polymer, a polymer mixture. In some aspects, the encapsulation material 12 can comprise an epoxy material or an epoxy matrix with a filler. In some aspects, the filler can contain silicon oxide ($SiO_2$), wherein the encapsulation material 12 can have a dielectric constant of approximately 4 to approximately 4.2. In some aspects, the filler can contain aluminum oxide (AlO), wherein a dielectric constant of the encapsulation material 12 can be in a range of approximately 5 to approximately 10.

The semiconductor device 100 can provide a small package at high radiation frequencies. In the course of the technical development of semiconductor devices, on the one hand the used frequencies of the electromagnetic waves emitted are becoming higher and higher, while on the other hand the dimensions of the device package are becoming smaller and smaller. This discrepancy can be combatted by an "electrical extension of the package" in order to harmonize the physical package size with the wavelengths used. In some aspects, as shown in FIG. 1, this can be achieved using the extension element 8 as a physical extension of the structure that emits the electromagnetic waves. Owing to the use of the extension element 8, the electric current has to cover a longer path until it reaches the end of the antenna formed, which from an electrical standpoint is equivalent to an extension of the package.

Furthermore, the semiconductor device 100 can be more cost-effective and save more space in comparison with conventional semiconductor devices. In conventional semiconductor devices having the same functionality, the antennas may usually be present in the form of separate components. In contrast thereto, in the case of the semiconductor devices in accordance with the disclosure, the antenna or the emitting structure can be completely integrated into the semiconductor device. This can save costs for additional manufacture of these separate components. Furthermore, space on the populated printed circuit board can be saved and an increased system integration can be achieved.

Figure 2:
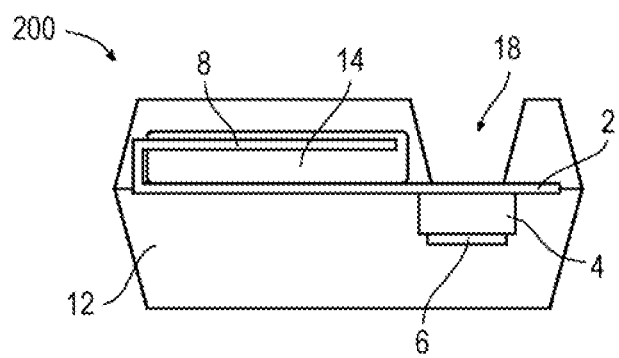
FIG. 2 is a diagram schematically illustrating a cross-sectional side view of a semiconductor device, in accordance with the disclosure.

The semiconductor device 200 in FIG. 2 can be at least partly similar to the semiconductor device 100 in FIG. 1 and have the same functionalities. In some aspects, the semiconductor device 200 in FIG. 2 can additionally comprise an optional dielectric material 14, which can cover the extension element 8 and have a dielectric constant of greater than 5. In some aspects, the dielectric material 14 can comprise an epoxy matrix with aluminum oxide as filler, as already described in association with FIG. 1. The dielectric material 14 can be configured to increase the performance of the antenna formed by the extension element 8 by an adaptation of the dielectric constant. As a result of the increased dielectric constant in comparison with conventional mold compounds, a velocity of propagation of the waves emitted by the antenna can be reduced, which may be equivalent to the electrical extension of the package of the semiconductor device 200 as described in association with FIG. 1. In some aspects, the dielectric material 14 can furthermore have the function of the spacer 10 in FIG. 1.

Figure 3:
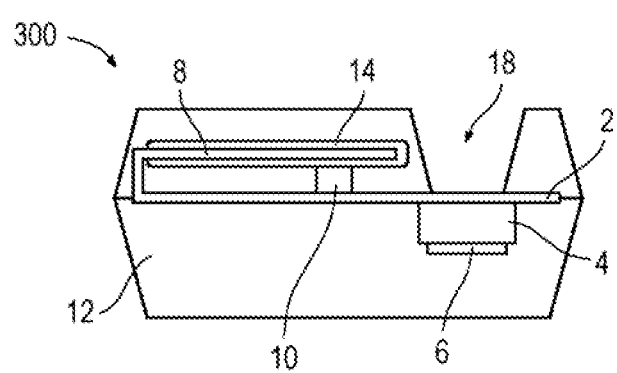
FIG. 3 is a diagram schematically illustrating a cross-sectional side view of a semiconductor device, in accordance with the disclosure.

The semiconductor device 300 in FIG. 3 can be at least partly similar to the semiconductor devices described above and have the same functionalities. In some aspects, the semiconductor device 300 in FIG. 3 can additionally have a spacer 10, which can mechanically contact the top side of the chip carrier 2 and the underside of the dielectric material 14.

Figure 4:
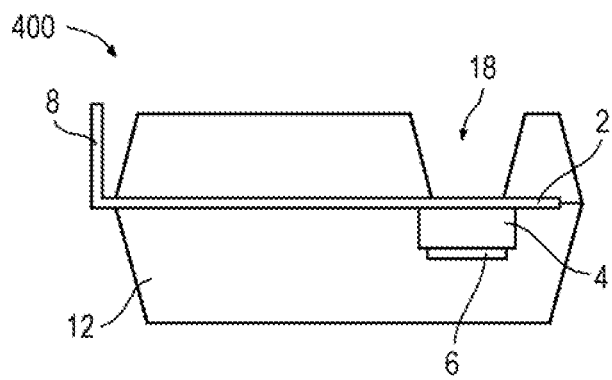
FIG. 4 is a diagram schematically illustrating a cross-sectional side view of a semiconductor device, in accordance with the disclosure.

The semiconductor device 400 in FIG. 4 can be at least partly similar to the semiconductor devices in the figures described above. In some aspects, the extension element 8 in FIG. 4 can at least partly project from the encapsulation material 12. In some aspects, as shown in FIG. 4, the extension element 8 and the mounting plane of the chip carrier 2 can run substantially perpendicular to one another. In some aspects, an angle between the extension element 8 and the mounting plane can be chosen arbitrarily differently depending on the geometric shape of the encapsulation material 12. The chip carrier 2 can comprise a leadframe, for example, wherein the extension element 8 can be formed by a bent connection conductor of the leadframe.

Figure 5:
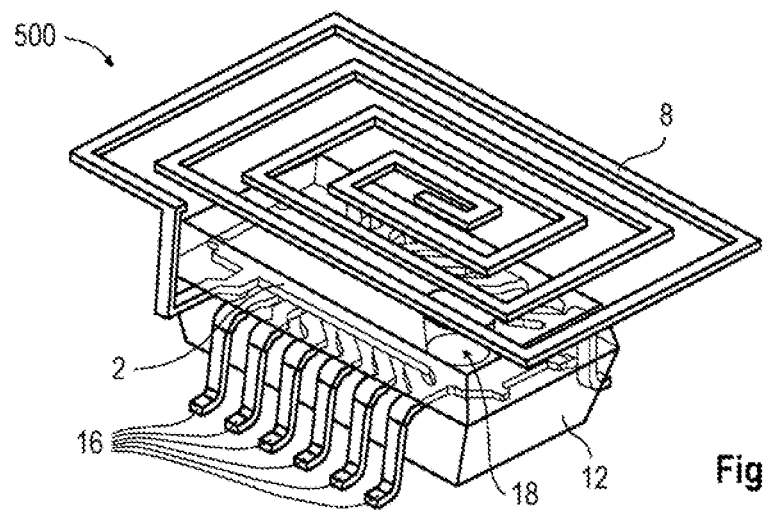
FIG. 5 is a diagram illustrating a perspective view of a semiconductor device, in accordance with the disclosure.

The semiconductor device 500 in FIG. 5 can be at least partly similar to the semiconductor devices in the figures described above. In some aspects, as shown in FIG. 5, the chip carrier 2 can be embodied in the form of a leadframe with one or more die pads and one or more connection conductors. A plurality of the connection conductors 16 can project from the encapsulation material 12 and provide an electrical contacting of the electronic components encapsulated by the encapsulation material 12 from outside the package. The semiconductor device 500 can be a "leaded" package. For example, the semiconductor device 500 can be a "gullwing" package. However, semiconductor devices in accordance with the disclosure are not restricted to a specific type of package. In the aspect shown in FIG. 5, the extension element 8 can be formed from a connection conductor of the leadframe and have a spiral course, e.g. can form a spiral antenna. In this aspect, the extension element 8 can run substantially parallel to the top side of the package formed by the encapsulation material 12.

Figure 6:
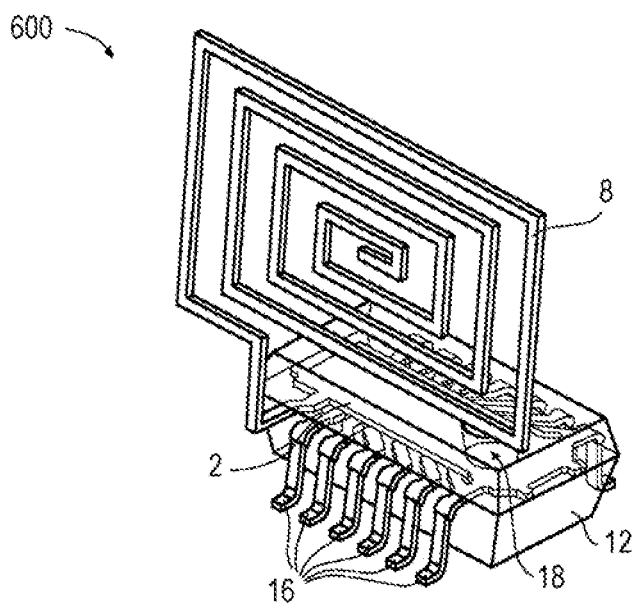
FIG. 6 is a diagram illustrating a perspective view of a semiconductor device, in accordance with the disclosure.

The semiconductor device 600 in FIG. 6 can be at least partly similar to the semiconductor device 500 in FIG. 5. In some aspects, the spirally formed extension element 8 in FIG. 6 can run substantially perpendicular to the top side of the package. In aspects, an angle between the extension element 8 and the top side of the package can be chosen arbitrarily differently depending on the geometric shape of the encapsulation material 12.

Figure 7:
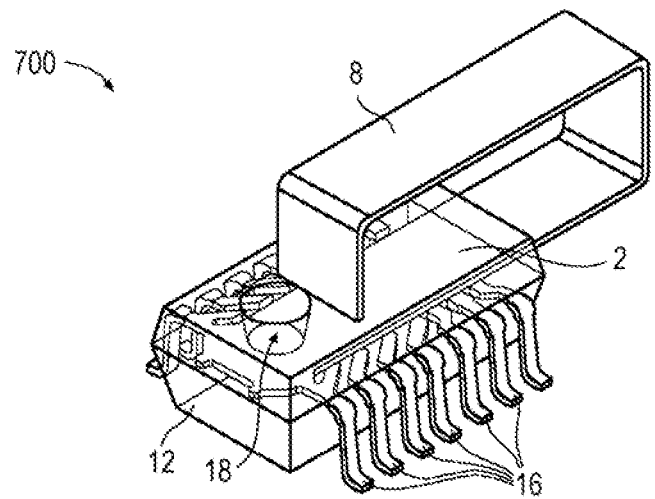
FIG. 7 is a diagram illustrating a perspective view of a semiconductor device, in accordance with the disclosure.

The semiconductor device 700 of FIG. 7 shows a further possible geometric shape of the extension element 8. In the aspect shown in FIG. 7, a section of the chip carrier 2 can project from the rear side of the package and the section of the chip carrier 2 which is not covered by the encapsulation material 12 can form the extension element 8. The extension element 8 can be bent at an angle of approximately 90 degrees at three points. On account of the geometric shape of the extension element 8, the semiconductor package 700 can be fashioned in the shape of a scorpion.

Figure 8:
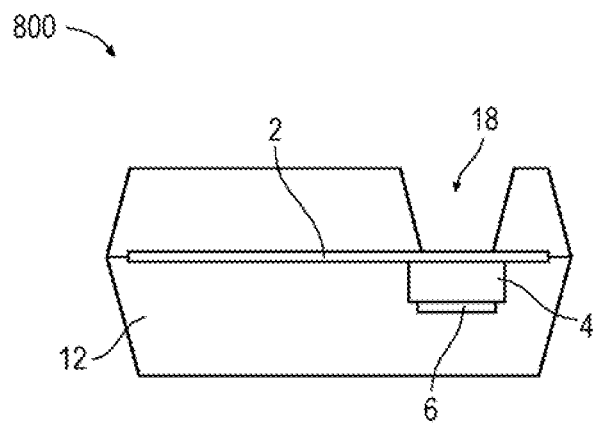
FIG. 8 is a diagram schematically illustrating a cross-sectional side view of a semiconductor device, in accordance with the disclosure.

The semiconductor device 800 in FIG. 8 can have an electrically conductive chip carrier 2 and a MEMS sensor chip 4 mounted on the underside of the chip carrier. Furthermore, a logic chip 6 can be arranged on the MEMS sensor chip 4. At least one part of the chip carrier 2 can be configured as an antenna. In some aspects, the chip carrier 2 can have a rectangular shape as viewed from above. The chip carrier 2 and the chips 4, 6 can be at least partly encapsulated by an encapsulation material 12, which can have a dielectric constant of greater than 5.

The encapsulation material 12 can comprise for example at least one from a mold compound, a laminate, an epoxy, a filled epoxy, a glass-fiber-filled epoxy, an imide, a thermoplastic, a thermosetting polymer, a polymer mixture. In some aspects, the encapsulation material 12 can comprise an epoxy material or an epoxy matrix with a filler. In some aspects, the filler can contain aluminum oxide (AlO), wherein a dielectric constant of the encapsulation material 12 can be in a range of approximately 5 to approximately 10. As a result of the increased dielectric constant of the encapsulation material 12 in comparison with conventional package materials, a velocity of propagation of the electromagnetic waves emitted by the antenna can be reduced, which may be equivalent to an electrical extension of the semiconductor device package as already described in association with FIG. 1.

Figure 9A:
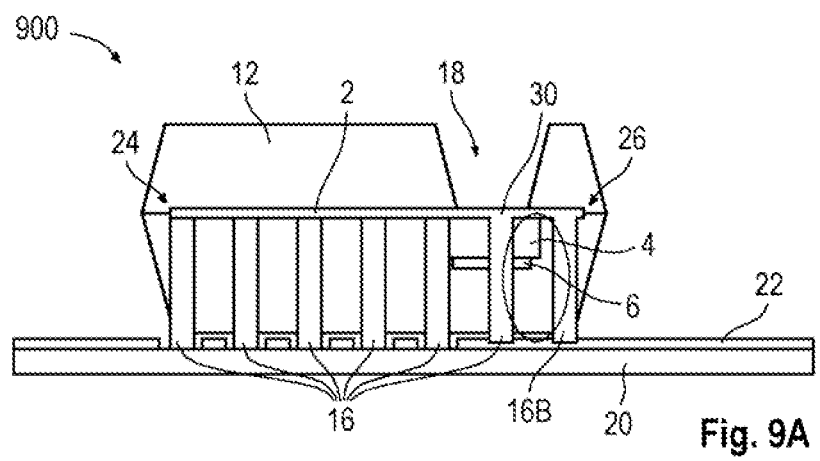
FIGS. 9A and 9B are diagrams illustrating a cross-sectional side view and a plan view of a semiconductor device, in accordance with the disclosure.
Figure 9B:
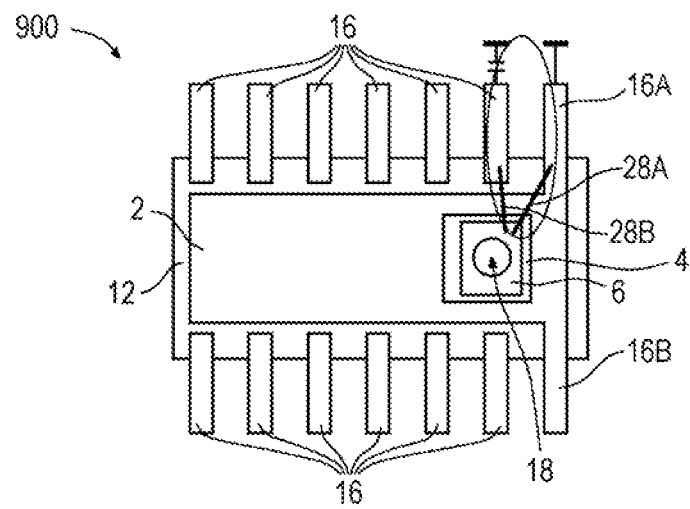

The semiconductor device 900 in FIGS. 9A and 9B can be regarded as a more detailed implementation of the semiconductor device 800 in FIG. 8. Therefore, explanations in association with FIG. 8 may also apply to FIGS. 9A and 9B, and vice versa. The semiconductor device 900 can be mounted on a printed circuit board 20, which may or may not be regarded as part of the semiconductor device 900. In the example in FIGS. 9A and 9B, the chip carrier 2 can have a multiplicity of connection conductors 16. In this case, the connection conductors 16A and 16B shown on the far right in FIGS. 9A and 9B can be formed in one piece with the chip carrier 2, while the remaining connection conductors 16 can be electrically insulated from the chip carrier 2. The chip carrier 2 can be connected to a ground potential or a ground surface 22 of the printed circuit board 20 via the connection conductors 16A, 16B.

The chip carrier 2 can form at least one part of an inverted F-antenna. In FIGS. 9A and 9B, in this case, a hot end 24 of the F-antenna can be arranged on the left and a cold end 26 of the F-antenna can be arranged on the right. The cold end 26 can be connected to the ground potential 22, while the RF voltage can be the highest at the hot end 24. A power amplifier (not shown) contained in the logic chip 6 can be connected to the ground potential 22 via a first electrical connection element 28A and the connection conductor 16A. Furthermore, an output of the power amplifier can be electrically connected to one of the remaining connection conductors 16 via a second electrical connection element 28B. During operation of the semiconductor device 900, the power amplifier can generate a radio-frequency current loop, indicated in the form of an ellipse in FIGS. 9A and 9B. In other words, the chip carrier 2 and the connection conductor electrically connected to the output of the power amplifier can form a conductor loop of the inverted F-antenna. A feed-in point 30 of the inverted F-antenna is identified in the cross-sectional side view in FIG. 9A.

Figure 10:
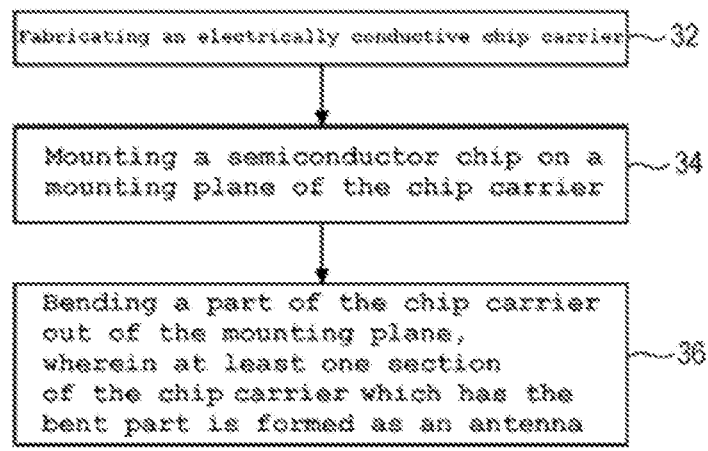
FIG. 10 is a flowchart of an example process, in accordance with the disclosure.

The method in FIG. 10 is a method for producing a semiconductor device. The method is presented in a general way in order to qualitatively describe aspects of the disclosure. The method can have further aspects, which are not shown and described in FIG. 10 for the sake of simplicity.

By way of example, the method can be augmented by one or more of the aspects described in connection with preceding figures.

At 32, an electrically conductive chip carrier can be fabricated. At 34, a semiconductor chip can be mounted on a mounting plane of the chip carrier. At 36, a part of the chip carrier can be bent out of the mounting plane, wherein at least one section of the chip carrier which has the bent part can be configured as an antenna. The method in FIG. 10 can have further optional actions. By way of example, in one further action, after bending the chip carrier, the chip carrier and the semiconductor chip can be at least partly encapsulated by an encapsulation material.

Figure 11A:
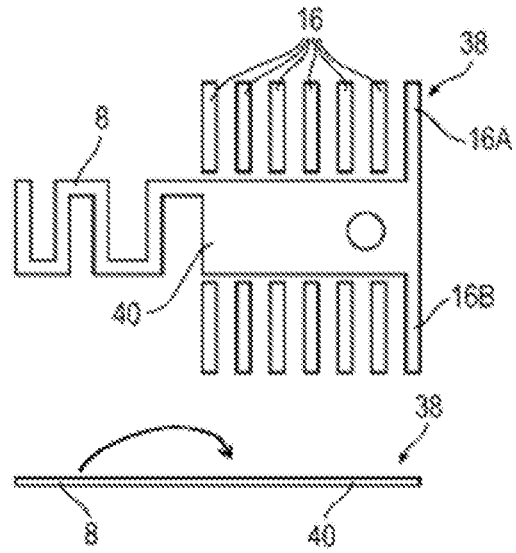
FIGS. 11A and 11B are diagrams illustrating method actions of a method for producing a semiconductor device, in accordance with the disclosure.
Figure 11B:
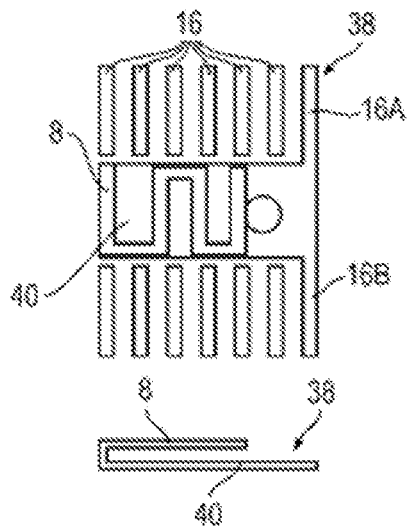

FIGS. 11A and 11B illustrate method actions of a method for producing a semiconductor device in accordance with the disclosure. In this case, the upper drawing in the respective figure shows a plan view and the lower drawing a cross-sectional side view of the respective method action. The actions shown in FIGS. 11A and 11B can be for example part of the method shown and described in FIG. 10.

In FIG. 11A, an electrically conductive chip carrier in the form of a leadframe 38 can be provided. The leadframe 38 can have a die pad 40, a multiplicity of connection conductors 16 and an extension element 8. The leadframe 38 can be stamped or etched from a planar metal sheet, for example. In some aspects, the leadframe 38 and the extension element 8 can be manufactured by a subtractive method, e.g. a method in which material is removed from the initially unprocessed metal sheet. To put it another way, the extension element 8 may not be added or affixed to the leadframe 38 in the sense of an additive method. In FIG. 11A, the extension element 8 can have a meandering course, for example. In some aspects, the shape of the extension element 8 can be chosen differently, for example as coil-shaped or spiral.

In FIG. 11B, the extension element 8 can be bent out of the mounting plane (cf. arrow in FIG. 11A), such that the extension element 8 and the mounting plane or the die pad 40 have sections which are situated opposite one another and which run substantially parallel, as is also shown and described in FIG. 1, for example. The method shown can have one or more further actions, which are not illustrated in FIGS. 11A and 11B for the sake of simplicity. By way of example, in a further method action, one or more semiconductor chips can be mounted on the die pad 40. In this case, the mounting can be carried out before or after the process of bending the extension element 8 out of the mounting plane. In another further method action, the components of the arrangement can be embedded into an encapsulation material.

Figure 12A:
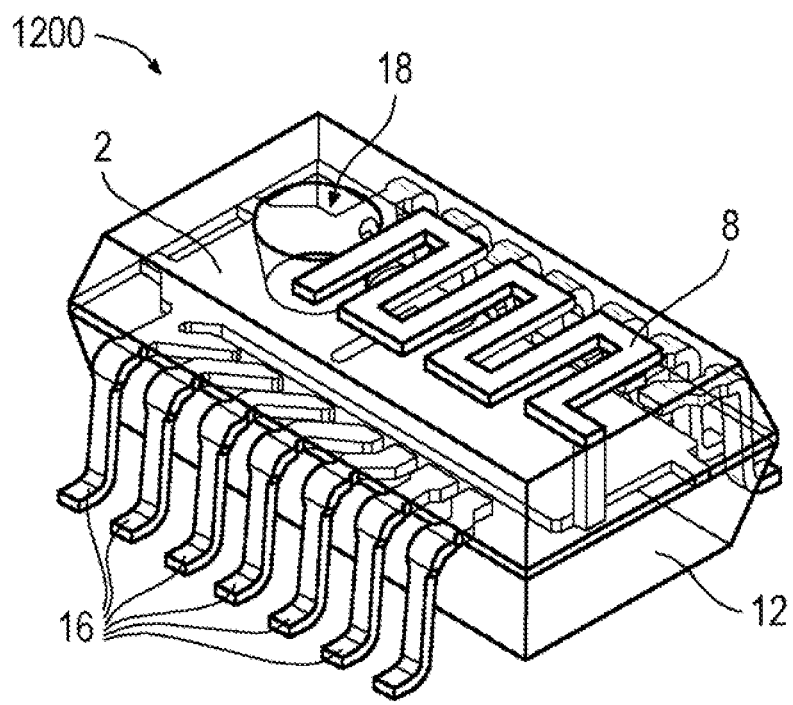
FIGS. 12A and 12B are diagrams illustrating a perspective view and a plan view of a semiconductor device, in accordance with the disclosure.
Figure 12B:
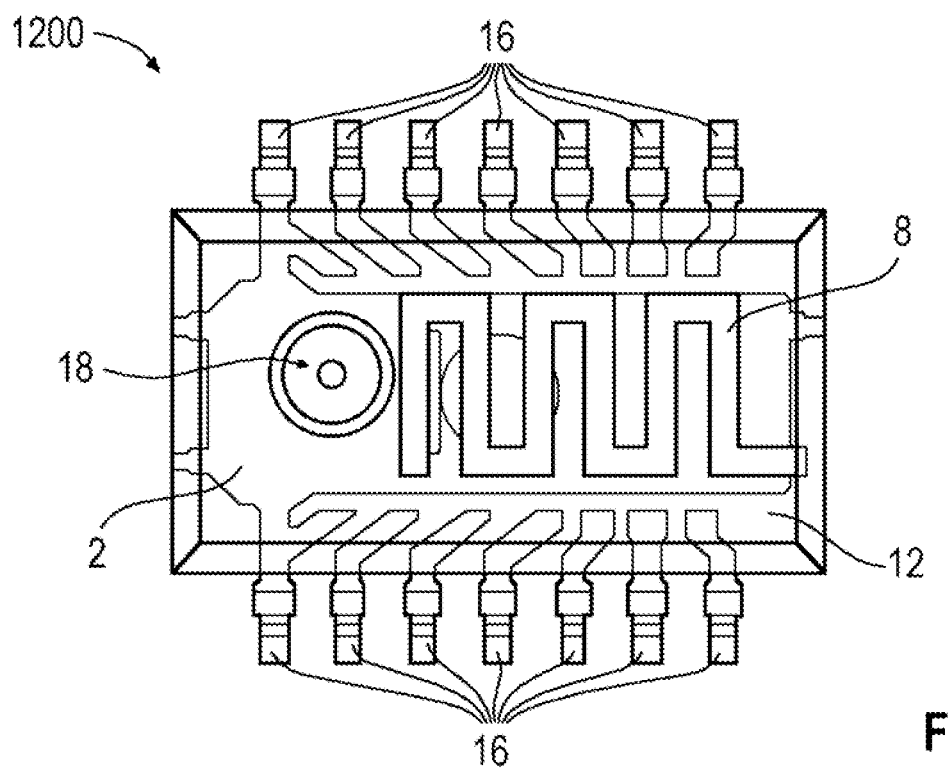

The semiconductor device 1200 in FIGS. 12A and 12B can be at least partly similar to the semiconductor devices in the figures described above, for example to the semiconductor device 500 in FIG. 5. In some aspects, the extension element 8 in FIGS. 12A and 12B can have a meandering course. In some aspects, the extension element 8 can project from the encapsulation material 12 and not be covered by the latter. In this case, the extension element 8 can run substantially parallel to the top side of the package formed by the encapsulation material 12. In some aspects, the extension element 8 can be, in particular completely, covered by the encapsulation material 12 or encapsulated thereby.

Aspects

Devices and methods are explained below based on aspects described herein.

Aspect 1 is a semiconductor device comprising: a semiconductor chip; an electrically conductive chip carrier, wherein the semiconductor chip is mounted on the chip carrier; and an electrically conductive extension element mechanically connected to the chip carrier, wherein the extension element and the chip carrier are formed as an integral single piece, wherein a part of the chip carrier which has the extension element is configured as an antenna.

Aspect 2 is a semiconductor device according to aspect 1, wherein the extension element is formed by a bent part of the chip carrier.

Aspect 3 is a semiconductor device according to aspects 1 or 2, wherein the semiconductor chip is mounted on a mounting plane of the chip carrier and the extension element is bent out of the mounting plane.

Aspect 4 is a semiconductor device according to aspect 3, wherein the extension element and the mounting plane have sections which are situated opposite one another and which run substantially parallel.

Aspect 5 is a semiconductor device according to any of the preceding aspects, wherein the extension element has a meandering or coil-shaped course.

Aspect 6 is a semiconductor device according to any of the preceding aspects, wherein the chip carrier comprises a leadframe and the extension element is formed by a bent connection conductor of the leadframe.

Aspect 7 is a semiconductor device according to any of aspects 3 through 6, wherein the extension element and the mounting plane run substantially perpendicular to one another.

Aspect 8 is a semiconductor device according to any of the preceding aspects, wherein the semiconductor chip comprises at least one MEMS structure and the antenna is configured to transmit signals detected by the MEMS structure.

Aspect 9 is a semiconductor device according to any of the preceding aspects, wherein the semiconductor chip and the extension element are arranged over opposite surfaces of the chip carrier.

Aspect 10 is a semiconductor device according to any of the preceding aspects, furthermore comprising: an encapsulation material, wherein the chip carrier and the semiconductor chip are at least partly encapsulated by the encapsulation material.

Aspect 11 is a semiconductor device according to aspect 10, wherein the extension element projects at least partly from the encapsulation material.

Aspect 12 is a semiconductor device according to aspect 10, wherein the extension element is completely encapsulated by the encapsulation material.

Aspect 13 is a semiconductor device according to any of aspects 3 through 12, furthermore comprising: a spacer, wherein the spacer is arranged between the extension element and the mounting plane and mechanically contacts the extension element and the mounting plane.

Aspect 14 is a semiconductor device according to any of the preceding aspects, furthermore comprising: a dielectric material covering the extension element, wherein the dielectric material has a dielectric constant of greater than 5.

Aspect 15 is a method for producing a semiconductor device, wherein the method comprises: fabricating an electrically conductive chip carrier; mounting a semiconductor chip on a mounting plane of the chip carrier; and bending a part of the chip carrier out of the mounting plane, wherein at least one section of the chip carrier which has the bent part is configured as an antenna.

Aspect 16 is a method according to aspect 15, furthermore comprising: after bending the chip carrier, at least partly encapsulating the chip carrier and the semiconductor chip using an encapsulation material.

Aspect 17 is a semiconductor device, comprising: an electrically conductive chip carrier; a semiconductor chip mounted on the chip carrier; and an encapsulation material, wherein the chip carrier and the semiconductor chip are at least partly encapsulated by the encapsulation material, wherein at least one part of the chip carrier is configured as an antenna, and wherein the encapsulation material has a dielectric constant of greater than 5.

Aspect 18 is a semiconductor device according to aspect 17, wherein the encapsulation material comprises an epoxy material filled with aluminum oxide.

Aspect 19 is a semiconductor device according to aspects 17 or 18, wherein the chip carrier forms at least one part of an inverted F-antenna.

Aspect 20 is a semiconductor device according to aspect 19, wherein the chip carrier comprises a connection conductor, wherein the chip carrier is connected to a ground potential, wherein the chip carrier and the connection conductor form a conductor loop of the inverted F-antenna.

Although specific implementations have been illustrated and described herein, it is obvious to the person skilled in the art that a multiplicity of alternative and/or equivalent implementations can replace the specific implementations shown and described, without departing from the scope of the present disclosure. This application is intended to cover all adaptations or variations of the specific implementations discussed herein. Therefore, the intention is for this disclosure to be restricted only by the claims and the equivalents thereof.

The invention claimed is:

1. A semiconductor device comprising:
a chip carrier comprising a first side and a second side of the chip carrier, wherein the second side is opposite from the first side of the chip carrier;
a semiconductor chip, comprising a micro electro-mechanical system (MEMS) structure, mounted on the first side of the chip carrier;
an extension element, mechanically connected directly to the chip carrier, extending from the second side of the chip carrier in a direction opposite and away from the first side of the chip carrier,
wherein the extension element and the chip carrier are formed as an integral single piece such that there is no contact resistance between the chip carrier and the extension element,
wherein a part of the chip carrier which has the extension element is configured as an antenna, and
wherein the extension element is configured to emit electromagnetic radiation; and
an encapsulation material at least partially encapsulating the first side and the second side of the chip carrier,
wherein the encapsulation material completely encapsulates the semiconductor chip, and
wherein, on the second side of the chip carrier, the encapsulation material has an opening or a depression exposing a portion of the chip carrier that is at a position corresponding to the MEMS structure on the first side of the chip carrier.

2. The semiconductor device as claimed in claim 1, wherein the extension element is formed by a bent part of the chip carrier.

3. The semiconductor device as claimed in claim 1, wherein the semiconductor chip is mounted on a mounting plane of the chip carrier and the extension element is bent out of the mounting plane, wherein the mounting plane is defined by the first side and the second side of the chip carrier such that the mounting plane is parallel to the first side and the second side of the chip carrier.

4. The semiconductor device as claimed in claim 3, wherein a section of the extension element is opposite of and runs parallel to a section of the mounting plane.

5. The semiconductor device as claimed in claim 3, wherein the extension element extends perpendicular to the mounting plane.

6. The semiconductor device as claimed in claim 3, further comprising:
a spacer, arranged between the extension element and the second side of the chip carrier, mechanically contacting the extension element and the second side of the chip carrier, wherein the spacer extends between the extension element and the second side of the chip carrier in a direction perpendicular to the second side of the chip carrier, wherein the spacer is made of an electrically insulating material.

7. The semiconductor device as claimed in claim 1, wherein the extension element has a meandering course or a coil-shaped course.

8. The semiconductor device as claimed in claim 1, wherein the chip carrier comprises a leadframe and the extension element is formed by a bent connection conductor of the leadframe.

9. The semiconductor device as claimed in claim 1, wherein the antenna is configured to transmit signals detected by the MEMS structure.

10. The semiconductor device as claimed in claim 1, further comprising:
a dielectric material covering the extension element, wherein the dielectric material has a dielectric constant of greater than 5.

11. The semiconductor device as claimed in claim 1, wherein the extension element extends outside of the encapsulation material.

12. The semiconductor device as claimed in claim 1, wherein the encapsulation material fully encapsulates the extension element.

13. The semiconductor device as claimed in claim 1, wherein the opening or depression of the encapsulation material defines an angled inner wall in the encapsulation material.

14. A semiconductor device, comprising:
a chip carrier comprising a first side and a second side, wherein the second side of the chip carrier is opposite from the first side of the chip carrier, and wherein at least one part of the chip carrier is configured as an antenna;
a semiconductor chip mounted on the first side of the chip carrier,
wherein the at least one part of the chip carrier includes a plurality of connection conductors that extend from the first side of the chip carrier to form the antenna for emitting electromagnetic radiation, wherein the plurality of connection conductors are laterally arranged with respect to the semiconductor chip on two opposing lateral sides of the semiconductor chip; and
an encapsulation material at least partially encapsulating the first side and the second side of the chip carrier, wherein encapsulation material completely encapsulates the semiconductor chip, and wherein the encapsulation material has a dielectric constant of greater than 5.

15. The semiconductor device as claimed in claim 14, wherein the encapsulation material comprises an epoxy material filled with aluminum oxide.

16. The semiconductor device as claimed in claim 14, wherein the chip carrier forms at least one part of an inverted F-antenna.

17. The semiconductor device as claimed in claim 16, wherein the chip carrier is connected to a ground potential, and wherein the plurality of connection conductors include a connection conductor that, together with the chip carrier, forms a conductor loop of the inverted F-antenna.

18. The semiconductor device as claimed in claim 14, wherein the chip carrier includes a cold end, including a first connection conductor of the plurality of connection conductors connected to a ground potential, and a hot end arranged opposite to the cold end and configured to have a highest radio frequency (RF) voltage.

19. The semiconductor device as claimed in claim 18, further comprising:
    a power amplifier having an input connected to the first connection conductor and an output connected to a second connection conductor of the plurality of connection conductors to form an RF current loop.

20. The semiconductor device as claimed in claim 14, wherein the two opposing lateral sides extend perpendicular to the first side of the chip carrier.

21. The semiconductor device as claimed in claim 14, wherein the plurality of connection conductors extend from the first side of the chip carrier parallel to the two opposing lateral sides.

* * * * *